United States Patent
Masnaghetti

(12) United States Patent (10) Patent No.: US 7,550,743 B1
Masnaghetti (45) Date of Patent: Jun. 23, 2009

(54) CHAMBERLESS SUBSTRATE HANDLING

(75) Inventor: Douglas K. Masnaghetti, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 353 days.

(21) Appl. No.: 11/690,176

(22) Filed: Mar. 23, 2007

(51) Int. Cl.
*H01J 33/02* (2006.01)
*H01J 37/18* (2006.01)

(52) U.S. Cl. ............... 250/440.11; 250/441.11; 250/442.11

(58) Field of Classification Search ................ None
See application file for complete search history.

(56) References Cited

U.S. PATENT DOCUMENTS

| | | | |
|---|---|---|---|
| 6,710,354 B1 * | 3/2004 | Koch et al. ............ 250/441.11 |
| 6,967,335 B1 * | 11/2005 | Dyer et al. ............ 250/442.11 |
| 7,288,774 B1 * | 10/2007 | Koch et al. ............ 250/441.11 |
| 7,288,859 B2 * | 10/2007 | Hazelton ................. 310/12 |
| 7,330,021 B2 * | 2/2008 | Kurita et al. ............ 324/100 |
| 2007/0029504 A1 * | 2/2007 | Saito et al. ............ 250/441.11 |
| 2008/0066678 A1 * | 3/2008 | Bluck et al. ............ 118/719 |
| 2009/0059190 A1 * | 3/2009 | Tanaka et al. ............ 355/30 |
| 2009/0078374 A1 * | 3/2009 | Bluck et al. ............ 156/345.32 |

* cited by examiner

*Primary Examiner*—David A. Vanore
(74) *Attorney, Agent, or Firm*—Luedeka, Neely & Graham, P.C.

(57) ABSTRACT

A particle beam system having a beam source for generating a particle beam and a vacuum air bearing. The beam source is mounted to a first side of the vacuum air bearing, with an active side of the vacuum air bearing disposed on an opposing second side of the vacuum air bearing. The active side is adapted to receive and retain a substrate. A beam port is formed completely through the vacuum air bearing from the first side to the second side. Means are provided for moving the substrate across the second side of the vacuum air bearing and positioning the substrate under the beam port. Means are also provided for sealing an interior of the beam source from exposure to atmosphere through the beam port.

20 Claims, 3 Drawing Sheets

CHAMBERLESS SUBSTRATE HANDLING

FIELD

This invention relates to the field of substrate handling. More particularly, this invention relates to presenting a substrate for inspection by a system, such as a charged particle beam inspection system, without the use of a vacuum chamber that encloses the substrate on a stage.

BACKGROUND

Particle beam systems, such as scanning electron microscopes, are typically used during integrated circuit fabrication for a variety of purposes. Some particle beam systems are used for etching layers of material on the substrates on which the integrated circuits are formed, others are used for depositing material onto the surface of the substrate, and others still—such as scanning electron microscopes—are used for inspection of the integrated circuits.

Particle beam systems typically operate by accelerating a charged species, such as an electron, positron, or proton, toward a target of some sort. In the example of an electron microscope, electrons are accelerated toward an inspection sample, and detection of the resultant scattering of secondary electrons is used to resolve images of the sample, or to determine the chemical composition of the sample.

Particle beam systems make use of a low pressure, or high vacuum, area that is formed around the sample. The high vacuum area is typically formed within a chamber that encompasses both the sample itself, and a movable stage upon which the sample resides. The high vacuum environment is important for the proper operation of the particle beam system. Further, the ability to move the sample, such as on the movable stage, also tends to be important to the convenient operation of the system.

However, providing a vacuum chamber of a sufficient size to contain the entire sample and movable stage adds cost, complexity, and size to the particle beam system.

What is needed, therefore, is a system that overcomes problems such as those described above, at least in part.

SUMMARY

The above and other needs are met by a particle beam system having a beam source for generating a particle beam and a vacuum air bearing. The beam source is mounted to a first side of the vacuum air bearing, with an active side of the vacuum air bearing disposed on an opposing second side of the vacuum air bearing. The active side is adapted to receive and retain a substrate. A beam port is formed completely through the vacuum air bearing from the first side to the second side. Means are provided for moving the substrate across the second side of the vacuum air bearing and positioning the substrate under the beam port. Means are also provided for sealing an interior of the beam source from exposure to atmosphere through the beam port.

In various embodiments, the particle beam system is a scanning electron microscope. The substrate may be a semiconductor wafer. In various embodiments, the means for moving the substrate includes at least one of a rotary chuck, a linear slide, a rotary chuck connected to a linear slide, and a controller for applying differential vacuum and gas flows to the vacuum air bearing in a manner to selectively cause at least one of rotation and translation of the substrate. The means for sealing variously includes at least one of a gate valve mounted inside of the beam port, a seal plate disposed on the second side of the vacuum air bearing, and the substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
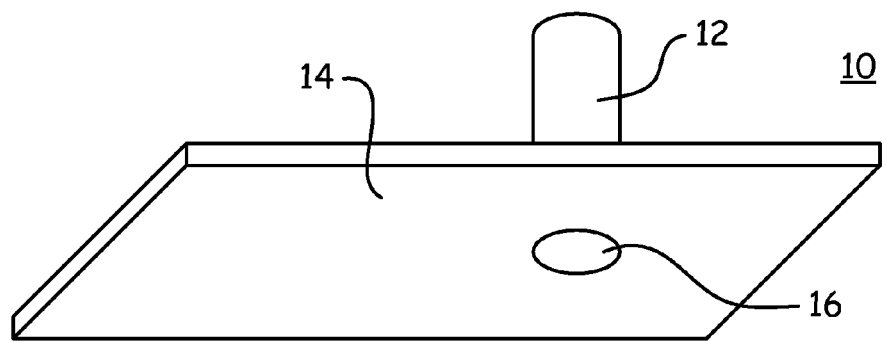
FIG. 1 is a bottom perspective view of a system according to an embodiment of the present invention.

With reference now to FIG. 1, there is depicted a simplified bottom perspective view of a system 10 according to one embodiment of the present invention. The system 10 of this embodiment includes a beam source or column 12, such as which emits a particle beam—for example, an electron beam, such as might be used in a scanning electron microscope. The system also includes a substrate handling system, including a vacuum air bearing 14, which is used as described in more detail below. A beam port 16 is provided so that the particle beam from the beam source 12 can contact the sample. In some embodiments, a gate valve or other means (not depicted) is placed just inside the beam port 16, so as to isolate the beam source 12 from the atmosphere. This may be useful when other methods of doing so are not provided.

Figure 2:
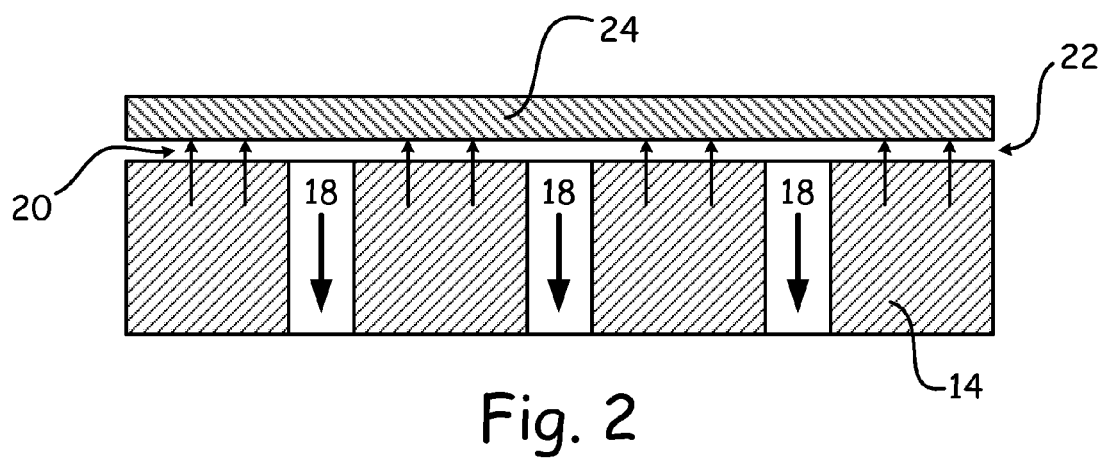
FIG. 2 is a side cross sectional view of a vacuum air bearing and substrate according to an embodiment of the present invention.

FIG. 2 provides additional detail in regard to the vacuum air bearing 14. The vacuum air bearing 14 operates by simultaneously drawing a vacuum in the direction indicated through relatively larger channels 18 and providing a gas flow 20 through relatively smaller channels (not depicted) in the opposite direction. The net effect is to create a thin gas buffer 22 having properties such that the substrate 24 is retained in proximity to the vacuum air bearing 14, but is not held in direct physical contact with the vacuum air bearing 14.

The gas flow 20 may be of air or of some other gas, such as nitrogen or argon, or of a mixture of such The channels through which the gas flow 20 are provided are, in some embodiments, machined channels or channels that are otherwise manufactured with a specified pattern. However, in other embodiments, the channels are formed by the porosity of the material from which the vacuum air bearing 14 is fabricated. By adjusting the relative flows of the vacuum in channels 18 and the gas flow 20, the size of the gas buffer 22 and even the movement of the substrate 24 across the surface of the vacuum air bearing 14 can be adjusted.

Figure 3:
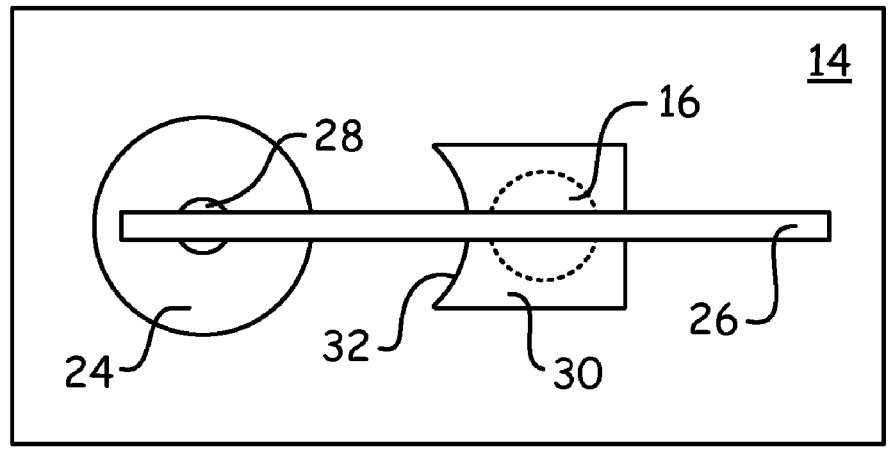
FIG. 3 is a bottom plan view of a substrate handling system in a first position according to an embodiment of the present invention.
Figure 4:
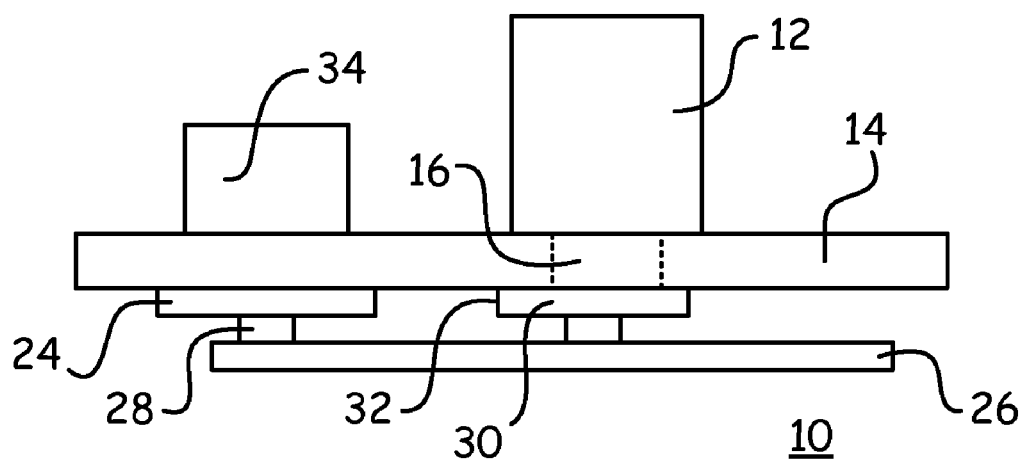
FIG. 4 is a side cross sectional view of a substrate handling system in a first position according to an embodiment of the present invention.

With reference now to FIGS. 3 and 4, another embodiment of the system 10 is depicted, which includes additional substrate handling elements. In this embodiment, the substrate 24 is delivered to the system 10 such as by a robot or other substrate 24 handler (not depicted). The substrate 24 is delivered to the system with the working face of the substrate 24 disposed against the vacuum air bearing 14. For example, if the system 10 is a scanning electron microscope, then the face of the substrate 24 that is to be inspected is placed toward the vacuum air bearing 14.

A linear slide 26 is also provided, which provides for linear movement of various elements of the system 10 in this embodiment. For example, a rotary chuck 28 may be attached to the linear slide 26. The rotary chuck 28 engages the open face of the substrate 24, and provides one means for the rotary alignment of the substrate 24. The linear slide 26 can then move the substrate 24 along the path of the linear slide 26, as the substrate 24 is retained by the rotary chuck 28, such as by vacuum, electrostatic, or other means.

A seal plate 30 may also be attached to the linear slide 26 in some embodiments, such that the seal plate 30 can be moved over the beam port 16, and selectively moved away from the beam port 16. In this manner, the seal plate 30 can provide a means for isolating the beam source 12 from atmosphere, which in some embodiments obviates the need for the gate or other valve mentioned above. In one embodiment, the seal plate 30 has an edge 32 that is shaped to receive the substrate 24 with a relatively high degree of precision, such that a very small gap can be maintained between the edge of the substrate 24 and the edge 32 of the seal plate 30. In one embodiment, this gap is no more than about a thousandth of an inch in all places. In some embodiments, the seal plate 30 is also supported by the vacuum air bearing 14, in the same manner as that described above in regard to the substrate 24.

Figure 5:
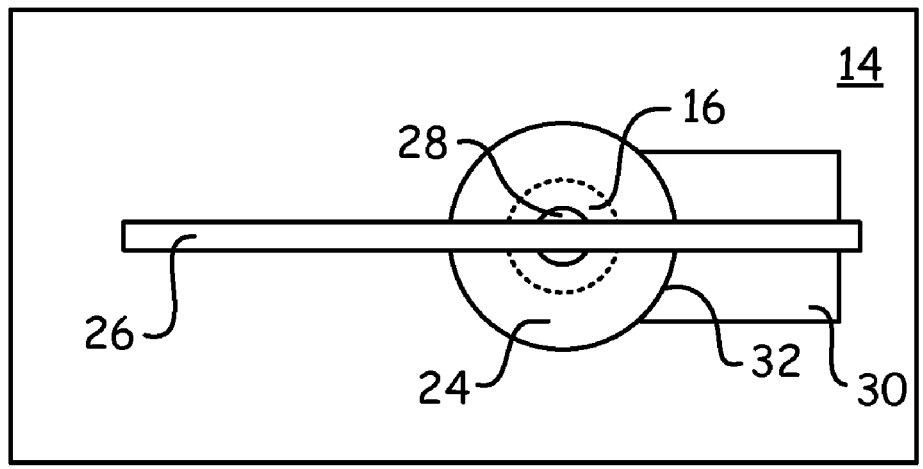
FIG. 5 is a bottom plan view of a substrate handling system in a second position according to an embodiment of the present invention.
Figure 6:
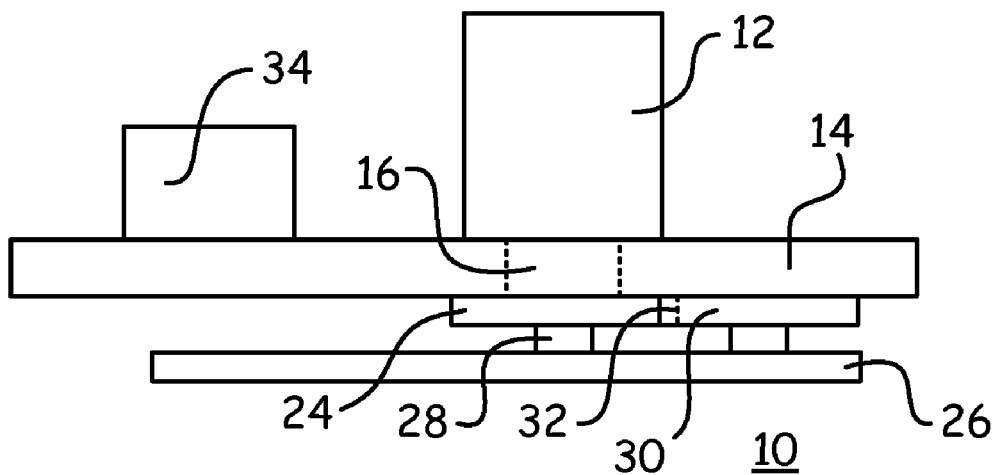
FIG. 6 is a side cross sectional view of a substrate handling system in a second position according to an embodiment of the present invention.

FIGS. 5 and 6 depict the system 10, where the substrate 24 has been slid over, such as by the linear slide 26, to where it either contacts the seal plate 30, or comes in such close proximity to the seal plate 30 as to form the gap as described above. With the substrate 24 and the seal plate 30 in such contact or proximity, they are then both moved together, while the contact or proximity is maintained, so that the substrate 24 is disposed under the beam port 16. By moving the substrate 24 under the beam port 16 in this manner, only a relatively slight additional and brief load is placed on the vacuum environment that is preferably maintained within the beam source 12.

Further, the vacuum air bearing 14 forms a seal against the substrate 24, such that the substrate 24 itself provides the functions of a gate valve or the seal plate 30 during the time that it is placed over the beam port 16. Because of the vacuum drawn against the substrate 24 within the beam source 12, the size of the beam port 16 is preferably determined based at least in part on limiting the air pressure force that is applied to the substrate 24, so that the substrate 24 is not damaged or warped to too great a degree.

The substrate 24 can be rotated and translated, such as by the rotary chuck 28 and the linear slide 26, such that any desired portion of the substrate 24 can be placed under at least a portion of the beam port 16, and the particle beam can access a desired location on the substrate 24. If it is desired to move an edge of the substrate 24 to a center portion of the beam port 16, such that the substrate 24 does not cover all of the beam port 16, then in one embodiment the seal plate 16 is moved with the substrate 24, such that both of the substrate 24 and the seal plate 16 are used to maintain the vacuum within the beam source 12. Most preferably, in such an embodiment, the gap between the substrate 24 and the edge 32 of the seal plate 30 is sufficiently small, and the capacity of the pump that is maintaining the vacuum in the beam source 12 is sufficiently large, that the desired level of vacuum within the beam source 12 can be maintained.

In some embodiments, some of the elements of the system 10, such as the linear slide 26 and the rotary chuck 28, are not provided. In these embodiments, the flows of the gas 20 and the vacuum in the channels 18 are differentially adjusted in different parts of the vacuum air bearing 14 such that the differential flows induce either rotation or translation of one or both of the substrate 24 and the seal plate 32. A controller 34 preferably controls the functions of the system 10 as generally described herein.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A particle beam system comprising:
   a beam source for generating a particle beam,
   a vacuum air bearing,
   the beam source mounted to a first side of the vacuum air bearing, with an active side of the vacuum air bearing disposed on an opposing second side of the vacuum air bearing, with the active side adapted to receive and retain a substrate,
   a beam port formed completely through the vacuum air bearing from the first side to the second side,
   means for moving the substrate across the second side of the vacuum air bearing and positioning the substrate under the beam port, and
   means for sealing an interior of the beam source from exposure to atmosphere through the beam port wherein the substrate is not enclosed within a vacuum chamber as it moves across a second side of the vacuum air bearing and is positioned under a beam port.

2. The system of claim 1, wherein the particle beam system is a scanning electron microscope.

3. The system of claim 1, wherein the substrate is a semiconductor wafer.

4. The system of claim 1, wherein the means for moving the substrate includes a rotary chuck.

5. The system of claim 1, wherein the means for moving the substrate includes a linear slide.

6. The system of claim 1, wherein the means for moving the substrate includes a rotary chuck connected to a linear slide.

7. The system of claim 1, wherein the means for moving the substrate includes a controller for applying differential vacuum and gas flows to the vacuum air bearing in a manner to selectively cause at least one of rotation and translation of the substrate.

8. The system of claim 1, wherein the means for sealing includes a gate valve mounted inside of the beam port.

9. The system of claim 1, wherein the means for sealing includes a seal plate disposed on the second side of the vacuum air bearing.

10. The system of claim 1, wherein the means for sealing includes the substrate.

11. A particle beam system comprising:
a beam source for generating a particle beam,
a vacuum air bearing,
the beam source mounted to a first side of the vacuum air bearing, with an active side of the vacuum air bearing disposed on an opposing second side of the vacuum air bearing, with the active side adapted to receive and retain a substrate,
a beam port formed completely through the vacuum air bearing from the first side to the second side,
means for moving the substrate across the second side of the vacuum air bearing and positioning the substrate under the beam port, the moving means including a rotary chuck for engaging and rotating the substrate, and a linear slide attached to the rotary chuck for translating the rotary chuck and the substrate, and
means for sealing an interior of the beam source from exposure to atmosphere through the beam port, the sealing means including a seal plate disposed on the second side of the vacuum air bearing wherein the substrate is not enclosed within a vacuum chamber as it moves across a second side of the vacuum air bearing and is positioned under a beam port.

12. The system of claim 11, wherein the particle beam system is a scanning electron microscope.

13. The system of claim 11, wherein the means for sealing includes a gate valve mounted inside of the beam port.

14. The system of claim 11, wherein the means for sealing includes the substrate.

15. The system of claim 11, wherein an edge of the seal plate has a profile adapted to fit an edge profile of the substrate such that any gap between the edge of the seal plate and the substrate is no more than one thousandth of an inch at any location along the gap.

16. A scanning electron microscope, comprising:
an electron beam source for generating an electron beam,
a vacuum air bearing,
the electron beam source mounted to a first side of the vacuum air bearing, with an active side of the vacuum air bearing disposed on an opposing second side of the vacuum air bearing, with the active side adapted to receive and retain a substrate,
a beam port formed completely through the vacuum air bearing from the first side to the second side,
means for moving the substrate across the second side of the vacuum air bearing and positioning the substrate under the beam port, the moving means including a rotary chuck for engaging and rotating the substrate, and a linear slide attached to the rotary chuck for translating the rotary chuck and the substrate, and
means for sealing an interior of the beam source from exposure to atmosphere through the beam port, the sealing means including a gate valve mounted inside of the beam port wherein the substrate is not enclosed within a vacuum chamber as it moves across a second side of the vacuum air bearing and is positioned under a beam port.

17. The microscope of claim 16, wherein the means for sealing includes the substrate.

18. The microscope of claim 16, wherein the means for sealing includes a seal plate disposed on the second side of the vacuum air bearing.

19. The microscope of claim 16, wherein an edge of the seal plate has a profile adapted to fit an edge profile of the substrate such that any gap between the edge of the seal plate and the substrate is no more than one thousandth of an inch at any location along the gap.

20. The microscope of claim 16, wherein the substrate is a semiconductor wafer.

* * * * *